United States Patent [19]
Gleim

[11] Patent Number: 5,005,114
[45] Date of Patent: Apr. 2, 1991

[54] CIRCUITRY FOR GENERATING PHASE-SHIFTED SINUSOIDAL VOLTAGES

[75] Inventor: Güunter Gleim, Villingen-Schwenningen, Fed. Rep. of Germany

[73] Assignee: Deutsche Thomson-Brandt GmbH, VS-Villingen, Fed. Rep. of Germany

[21] Appl. No.: 345,020

[22] Filed: Apr. 28, 1989

[30] Foreign Application Priority Data

Apr. 29, 1988 [DE] Fed. Rep. of Germany ....... 3814562

[51] Int. Cl.$^5$ ...................... H02M 7/42; H03B 27/00
[52] U.S. Cl. ......................................... 363/43; 363/95
[58] Field of Search ...................... 363/40, 41, 42, 43, 363/95, 140

[56] References Cited

U.S. PATENT DOCUMENTS

| | | | |
|---|---|---|---|
| 1,691,986 | 11/1928 | Nyquist | 363/43 |
| 3,052,833 | 9/1962 | Coolidge et al. | 363/43 |
| 3,919,619 | 11/1975 | Corry | 363/43 |
| 4,344,123 | 8/1982 | Bhagwat et al. | 363/43 |
| 4,467,407 | 8/1984 | Asano et al. | 363/43 |
| 4,685,043 | 8/1987 | Mehert | 363/43 |

*Primary Examiner*—Peter S. Wong
*Attorney, Agent, or Firm*—Max Fogiel

[57] ABSTRACT

An arrangement for generating phase-shifted sinusoidal voltages, in which a plurality of resistors are connected in series in a closed circular network to provide the sinusoidal voltages. Connecting junctions are located between the resistors, and each pair of connecting junctions has the same resistors therebetween. A source of direct-current voltage is cyclically advanced through the network so that two parallel branches of the network with the same number of resistors, are connected between the terminals of the voltage source. The resistors have all the same resistance values, and motor windings are connected between the connecting junctions. The voltage source is cyclically connected in sequence to the connecting junctions, so that phase-shifted sinusoidal voltage functions appear at the connecting junctions for the purpose of operating a motor. An annular shift register is synchronized by pulses from a generator and has as many output terminals as there are resistors in the network. These output terminals are, in turn, connected to switching stages that advance the direct-current voltage in a cyclical sequence from the output terminals of the shift register to the resistance network.

6 Claims, 3 Drawing Sheets

CIRCUITRY FOR GENERATING PHASE-SHIFTED SINUSOIDAL VOLTAGES

FIELD OF THE INVENTION

The invention concerns circuitry for generating phase-shifted sinusoidal voltages.

DESCRIPTION OF THE PRIOR ART

A known way of generating such voltages is to derive them from digital signals by way of digital-to-analog converters, one of which is needed for each voltage. To generate uniform voltage the converters must be precisely similar, meaning that they must be manufactured to very close tolerances.

SUMMARY OF THE INVENTION

The object of the present invention is to partly or entirely eliminate the tolerance problem and decrease the expenditures involved in generating the voltages. This object is attained by the measures recited in claim 1. Other advantageous embodiments of the invention are recited in the subsidiary claims.

Phase-shifted sinusoidal voltages are necessary for example for controlling multiple-phase winding motors, whereby the individual winding must be supplied with voltages that are as similar as possible, with function characteristics that deviate minimally.

BRIEF DESCRIPTION OF THE DRAWINGS

One embodiment of the invention, in the form of a multiple-phase winding motor, will now be described with reference to the drawing, wherein.

DESCRIPTION OF THE PREFERRED EMBODIMENT

Figure 1:
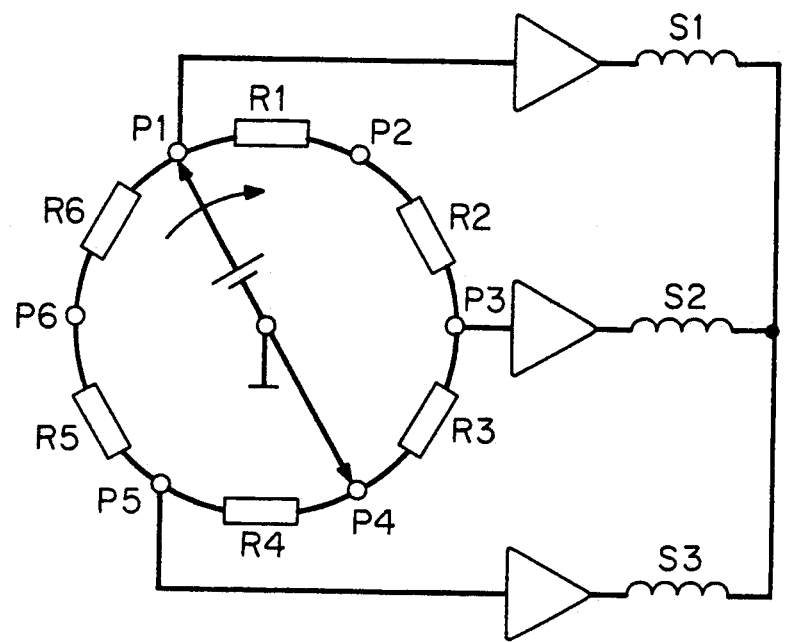
FIG. 1 illustrates the circuitry principle behind the invention.

FIG. 1 illustrates the basic principle of the circuitry, which will be described in detail hereinafter. Six resistors R1–R6 are arranged in a circle and interconnected by switching points P1–P6. The windings S1, S2, and S3 of a for example three-phase motor are symmetrically connected in a star (y) circuit with the resistance network 7 composed of resistors R1–R6 by way of switching points P1, P3, and P5. Switching points P2, P4, and P6 could alternatively be employed. All that is essential is that the same number of equivalent resistors be between each pair of connections to the windings of the motor. The windings of the motor are now activated by step-wise changing voltages in that a control circuit always cyclically advances a source of direct-current voltage U to two diametrically opposed points in resistance network 7, between switching points P1 and P4, P2 and P5, P3 and P6, P1 and P4, etc. for instance. It will be evident that, the more resistors in resistance network 7, the finer the increments in the voltage that controls windings S1, S2, and S3. It must, however, be ensured that the number of resistors is even and that the quotient of the number of resistors and of the number of motor windings or switching points is a whole number.

Figure 2:
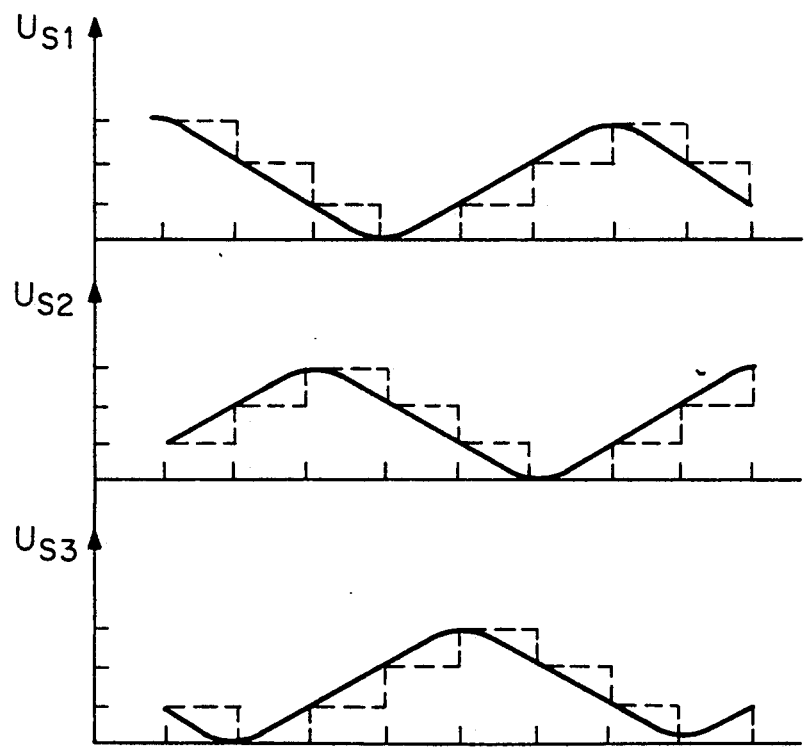
FIG. 2 illustrates the control voltages deriving from FIG. 1.

FIG. 2 illustrates the voltage that occurs at windings S1, S2, and S3.

Figure 3:
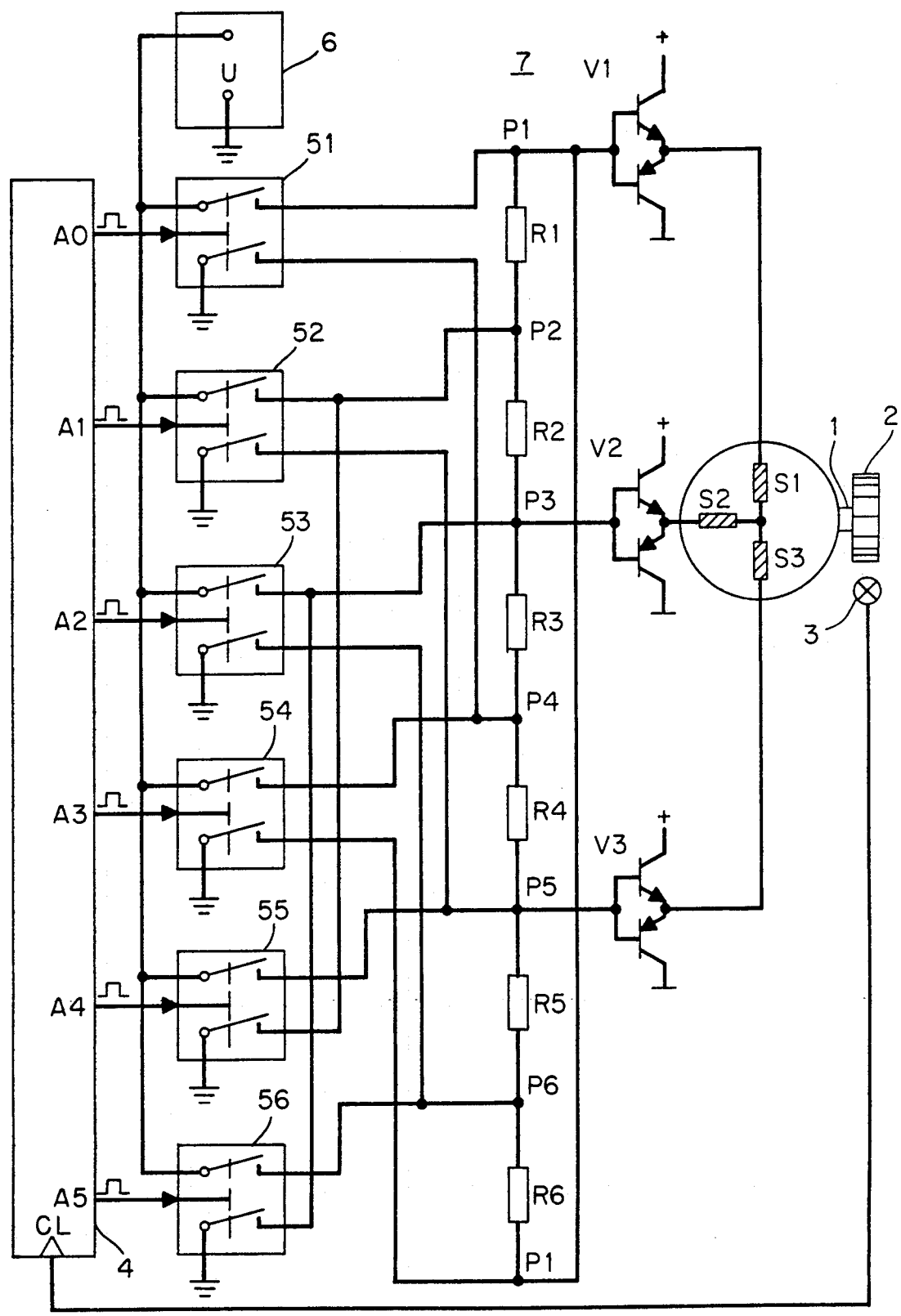
FIG. 3 is a detailed illustration of the invention.

FIG. 3 is a detailed illustration of one embodiment of the invention.

Figure 4:
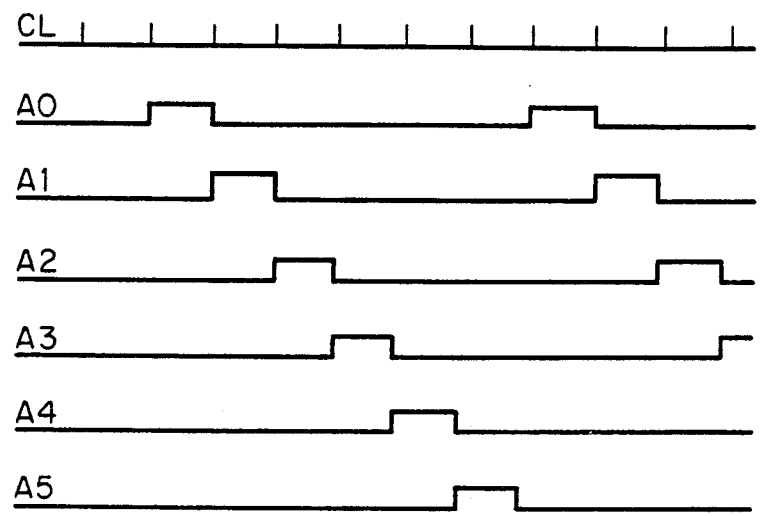
FIG. 4 is a pulse diagram.
Figure 5:
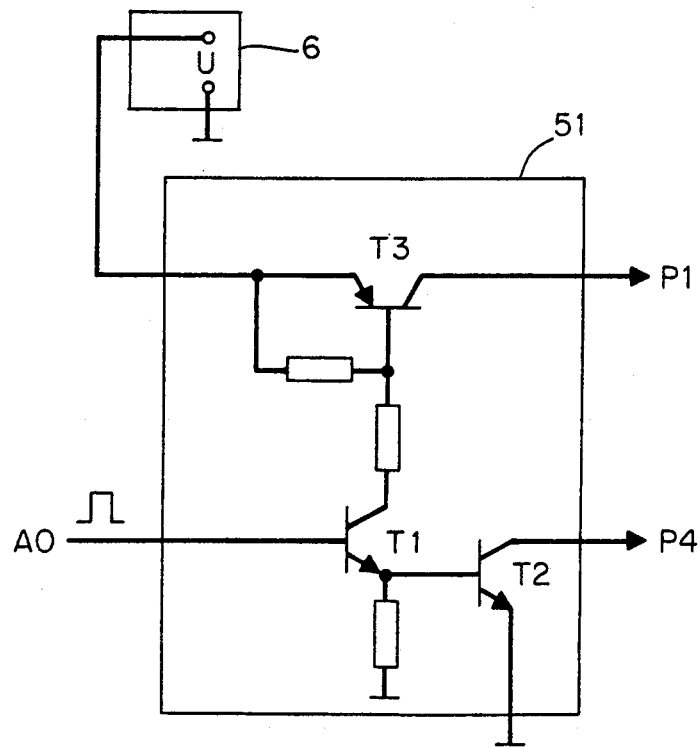
FIG. 5 illustrates a section of the circuitry illustrated in FIG. 3.

A generator 2, a tachogenerator for instance, on the shaft 1 of the motor, generates by way of a sensor 3 pulses that are forwarded to the clock input terminal CL of an annular shift register 4. Annular shift register 4 cyclically supplies the pulses illustrated in FIG. 4 to its output terminals A0–A5. The pulses sequentially control switching stages 51–56 that shift the voltage U from source 6 to the switching points P1 and P4, P2 and P5, P3 and P6, P1 and P4, etc. in resistance network 7. Similar control voltages, illustrated in FIG. 2, arrive at current amplifiers V1, V2, and V3 to control windings S1, S2, and S3.

Switching stages 51–56 can be designed as illustrated in FIG. 3. The pulse obtained from annular shift register 4 opens a transistor T2 by way of a switching transistor T1, connecting switching point P4 for example to one pole of voltage source 6 and, due to the opening of switching transistor T1 and the resulting opening of a transistor T3, connecting the other pole of source 6 to the switching point P1 in resistance network 7. The same procedure occurs with the other switching points in conjunction with their associated switching stages.

What is claimed is:

1. An arrangement for generating phase-shifted sinusoidal voltages, comprising: a plurality of resistors connected in series in a closed circular network for providing said sinusoidal voltages; connecting junctions between resistors, each pair of connecting junctions having the same resistors therebetween; a source of direct-current voltage with poles; means for cyclically advancing a direct-current voltage from said source through said network so that two parallel branches of said network with the same number of resistors are connected between said poles of said voltage source, said resistors having all the same resistance values; motor windings connected between said connecting junctions; said voltage source being cyclically connected in sequence to said connecting junctions so that phase-shifted sinusoidal voltage functions appear at said connecting junctions for operating a motor.

2. An arrangement as defined in claim 1, wherein all said resistors have the same characteristics.

3. An arrangement as defined in claim 1, wherein the number of resistors is an even number, the quotient of said even number of resistors and the number of connecting junctions is a whole number.

4. An arrangement as defined in claim 1, including an annular shift register; synchronizing generator means for emitting pulses to synchronize said shift register; said shift register having a number of outputs equal in the number of said resistors; switching stages connected to said outputs of said shift register for transmitting said direct-current voltage from said outputs of said shift register in cyclical sequence to said network so that said two parallel branches with the same number of resistors are connected between said poles of said voltage source.

5. An arrangement for generating phase-shifted sinusoidal voltages, comprising: a plurality of resistors connected in series in a closed circular network for providing said sinusoidal voltages; connecting junctions between resistors, each pair of connecting junctions having the same resistors therebetween; a source of direct-current voltage with poles; means for cyclically advancing a direct-current voltage from said source through said network so that two parallel branches of said network with the same number of resistors are connected between said poles of said voltage source, said resistors having all the same resistance values; motor windings connected between said connecting junctions; said voltage source being cyclically connected in sequence to said connecting junctions so that phase-shifted sinusoidal voltage functions appear at said connecting junctions for operating a motor; said resistors having all the same characteristics; the number of said resistors being an even number, the quotient of said even number and the number of connecting junctions being a whole number; an annular shift register; synchronizing generator means for providing synchronizing pulses to said shift register, said shift register having a number of outputs equal in number of said resistors; switching stages connected to said outputs for transmitting said direct-current voltage from said outputs in cyclical sequence to said network so that said two parallel branches of said network with the same number of resistors are connected between said poles of said voltage source.

6. An arrangement for generating phase-shifted sinusoidal voltages, comprising: a plurality of resistors connected in series in a closed circular network for providing said sinusoidal voltages; connecting junctions between resistors, each pair of connecting junctions having the same resistors therebetween; a source of direct-current voltage with poles; means for cyclically advancing a direct-current voltage from said source through said network so that two parallel branches of said network with the same number of resistors are connected between said poles of said voltage source, said resistors having all the same resistance values; motor windings connected between said connecting junctions; said voltage source being cyclically connected in sequence to said connecting junctions so that phase-shifted sinusoidal voltage functions appear at said connecting junctions for operating a motor; said resistors having all the same characteristics; the number of said resistors being an even number, the quotient of said even number and the number of connecting junctions being a whole number; an annular shift register; synchronizing generator means for providing synchronizing pulses to said shift register, said shift register having a number of outputs equal in number of said resistors; switching stages connected to said outputs for transmitting said direct-current voltage from said outputs in cyclical sequence to said network so that said two parallel branches of said network with the same number of resistors are connected between said poles of said voltage source; said motor windings being symmetrically connected for a three-phase motor; said synchronizing generator means comprising a tachogenerator; a motor having said motor windings and driving said tachogenerator; sensing means, said tachogenerator supplying pulses through said sensing means to a clock input of said shift register.

* * * * *